(12) United States Patent
Choy et al.

(10) Patent No.: US 6,785,177 B2
(45) Date of Patent: Aug. 31, 2004

(54) METHOD OF ACCESSING MEMORY AND DEVICE THEREOF

(75) Inventors: Jon S. Choy, Austin, TX (US); Bruce L. Morton, Austin, TX (US)

(73) Assignee: Freescale Semiconductor Inc., Austin, TX (US)

( * ) Notice: Subject to any disclaimer, the term of this patent is extended or adjusted under 35 U.S.C. 154(b) by 65 days.

(21) Appl. No.: 10/315,360

(22) Filed: Dec. 10, 2002

(65) Prior Publication Data

US 2004/0109372 A1 Jun. 10, 2004

(51) Int. Cl.[7] .................................................. G11C 7/00
(52) U.S. Cl. .............. 365/203; 365/230.06; 365/185.25
(58) Field of Search ............................. 365/203, 230.06, 365/185.23, 185.25

(56) References Cited

U.S. PATENT DOCUMENTS

| | | | |
|---|---|---|---|
| 4,916,336 A | * | 4/1990 | Houston ...................... 326/108 |
| 5,729,493 A | | 3/1998 | Morton |
| 5,768,206 A | | 6/1998 | McClure |
| 5,848,024 A | * | 12/1998 | Cho ........................ 365/230.06 |
| 6,021,072 A | | 2/2000 | Takeda et al. |
| 6,049,491 A | | 4/2000 | La Rosa |
| 6,185,140 B1 | | 2/2001 | Agrawal |

OTHER PUBLICATIONS

An Analysis of the i2164, Sep., 1981.

* cited by examiner

Primary Examiner—Tan T. Nguyen
(74) Attorney, Agent, or Firm—Toler Larson & Abel L.L.P.

(57) ABSTRACT

A memory device is disclosed having a column select transistor gate that is controlled by tri-statable control logic. The tri-statable control logic operates to allow the gate of the column select transistor to float during sensing of the bit cell. The column select transistor acts as a floating gate amplifier, i.e. a common gate amplifier having a gate that floats during the sensing period. In addition, the column select transistor can operate to facilitate decoding of the memory and to allow precharge of a bit line of a memory cell. Further, avoidance of a static power drain is made possible by the fact that the gate is floating during the sensing period.

21 Claims, 4 Drawing Sheets

METHOD OF ACCESSING MEMORY AND DEVICE THEREOF

FIELD OF THE DISCLOSURE

The present invention relates generally to memory devices, and more particularly to accessing memory devices.

BACKGROUND

It is well known that memory devices operate by selecting a particular memory cell to determine a charge state stored on the memory cell. The charge state stored on the memory cell is detected by a sense amplifier that translates the stored charge into a data value.

Existing memory devices typically use static circuitry to select specific bit lines to be charged, thereby permitting memory cell charge state detection during a sensing portion of the memory access.

With flash memory devices, typically several transistors are used to precharge a selected bitline to enable sensing the state of a selected memory cell. At least one of those transistors has the function of limiting the bitline voltage level to a predetermined level which allows sensing the bit cell's state reliably. The transistor used to enable the precharge of a bit line is typically a high gain device which is costly in terms of silicon real estate. In addition, the transistor that enables precharge of the bit line can serve to isolate the low voltage sensing circuitry from the high voltages that can be applied to the bitline during program or erase operations. Because of the high voltage isolation characteristics, the transistor is generally required to be a thick oxide device, which causes it to be especially large. Because memory density is governed by an ability to maintain small device sizes, the use of a high voltage, high gain device to support the column select results in a reduced array efficiency in terms of bit cell area relative to overall device size.

Therefore, it will be appreciated that alternate memory devices reducing the size and complexity of devices needed to perform the precharge and decode functions would be useful.

DETAILED DESCRIPTION OF THE FIGURES

A memory device is disclosed having a column select transistor gate that is controlled by tri-statable control logic. The tri-statable control logic operates to allow the gate of the column select transistor to float during sensing of the bit cell. The column select transistor acts as a floating gate amplifier, i.e. a common gate amplifier having a gate that floats during the sensing period. By allowing the gate of the column select transistor to be capacitively coupled to the same voltage reference as the memory transistor, an amplifier having a high degree of noise immunity during the sense operation is realized. In addition, the column select transistor can operate to facilitate decoding of the memory and to allow precharge of a bit line of a memory cell. Further, avoidance of a static power drain is made possible by the fact that the gate is floating during the sensing period. Therefore, the gate bias voltage may be generated using dynamic rather than static circuit means. The present disclosure can be better understood with reference to FIGS. 1–5.

Figure 1:
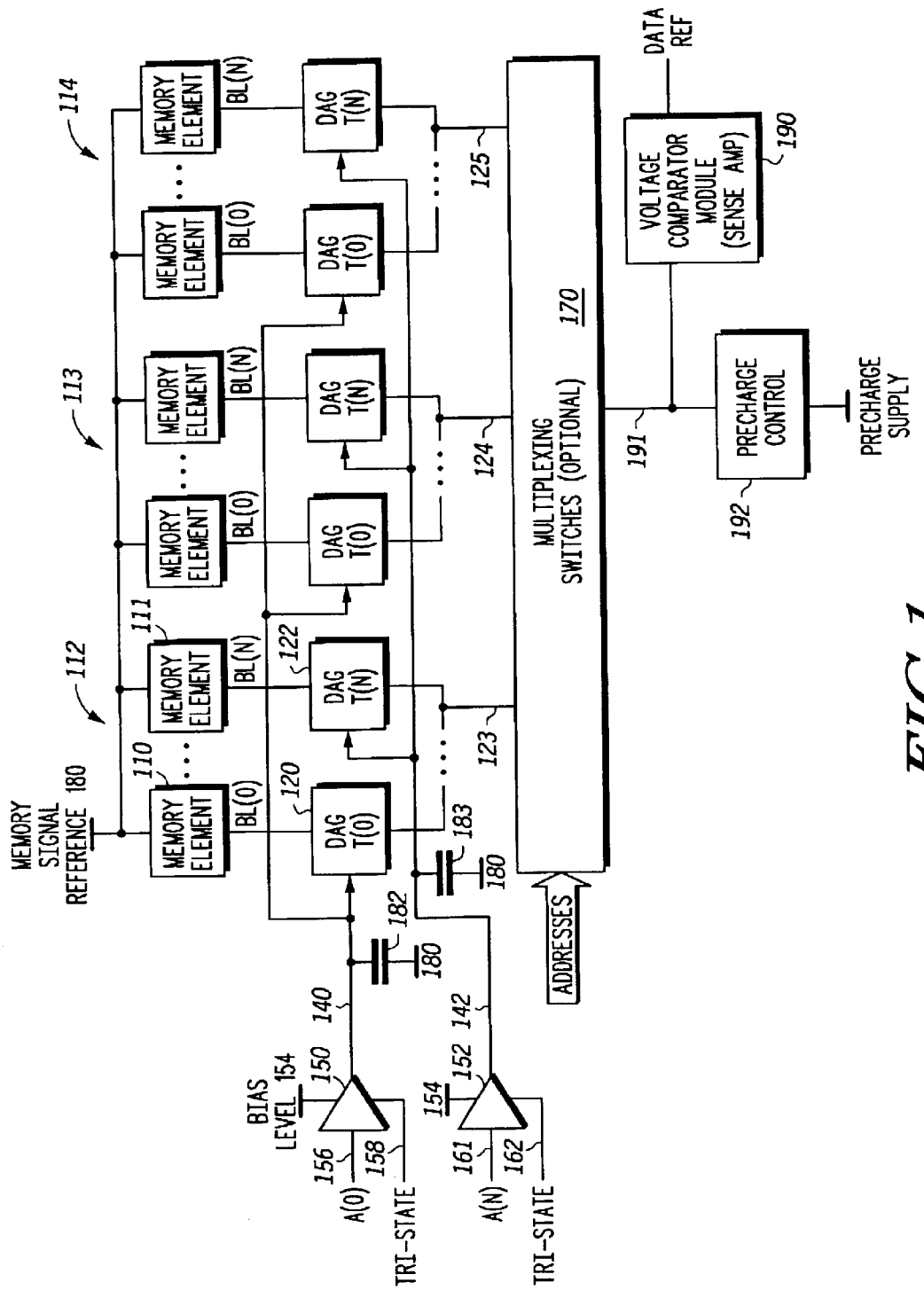
FIG. 1 illustrates a block diagram of a memory device in accordance with a specific embodiment of the present invention.

FIG. 1 illustrates, in block diagram form, a memory device in accordance with a specific embodiment of the present disclosure. The memory device of FIG. 1 includes precharge control 192, voltage comparator module 190, multiplexing switches 170, decode path groups 112 through 114, select gates 150 and 152, and capacitive elements 182 and 183.

The precharge control module 192 has a first node to be coupled to a precharge supply voltage, and a second node 191 (also called the data line) coupled to multiplexing switches 170 and to the voltage comparator module 190. The voltage comparison module 190, which is typically part of a sense amplifier, provides a data reference at its output indicating a logic state of a sensed memory cell. The multiplexing switches 170 are coupled to a plurality of data nodes 123 through 125. The data nodes 123 through 125 correspond to the data nodes for the decode path groups 112 through 114 respectively. The decode path group 112 includes a first path comprising the memory signal reference 180 coupled to memory element 110, which is connected to a Decode/Amplifier Gate (DAG) 120 through the bit line zero BL(0). An output node of the decode/amplifier gate 120 is coupled to the data node 123. In a similar manner, a second path of decode path group 112 includes memory element 111 and decode/amplifier gate 122. Note that the decode/amplifier gates 120 and 122 are abbreviated DAG T(#) (for example T(0), and T(N)). The T Designator indicates that in one embodiment decode/amplifier gate is represented by a transistor as will be disclosed further herein.

The decode/amplifier gate 120 is coupled to a tri-stating driver 150. The tri-stating driver 150 has a reference node coupled to a bias level 154, which controls the voltage provided at its output when enabled. A select signal labeled A(0) at node 156 represents the logic value of the signal to be driven at the output of the driver 150. A tri-state enable signal at node 158 tri-states the driver when enabled. An Nth tri-statable driver 152 is coupled to the decode/amplifier gate 122, having bias level 154, an address A(N) at node 161, a tri-state enable at node 162. Each of the tri-statable drivers 150 and 152 are coupled to multiple decode/amplifier gates through nodes 140 and 142 respectively, i.e. to one DAG transistor in each decode path group 112–114. The nodes 140 and 142 are capacitively coupled to the reference 180 through capacitors 182 and 183 respectively. The capacitors 182 and 183 may be discrete or parasitic capacitors.

In operation, it will be appreciated that during a precharge portion of a memory access, the precharge control 192 provides a representation of the precharge supply through the multiplexing switches 170 and through the decode/amplifier gates of each decode path group 112–114 to the bit lines of each memory element. During the precharge time each of the decode/amplifier gates associated with a bit line being precharged are enabled by their respective tri-statable drivers. This allows the precharge supply voltage provided by the precharge control 192 to charge the bit lines of each memory cell. Once the bit lines have been precharged, the tri-statable drivers controlling the selected decode/amplifier gate(s) are tri-stated, allowing the voltages controlling the selected decode/amplifier gates to float. Because the voltage controlling a combination of the selected gate is capacitively coupled to the memory signal reference voltage, the selected decode/amplifier gate and its corresponding memory element are substantially immune to noise during this time since they are both referenced to the memory signal reference voltage 180. This can be better understood with reference to FIG. 2.

Figure 2:
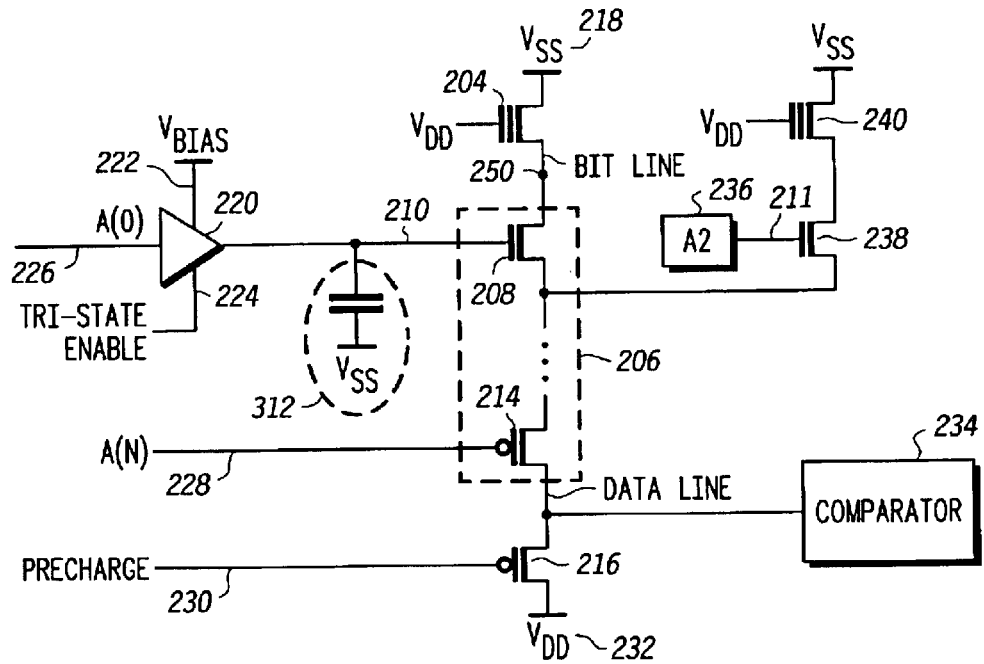
FIG. 2 illustrates a combination block diagram and schematic diagram of a portion of the memory device of FIG. 1 in accordance with a specific embodiment of the present invention.

FIG. 2 illustrates in block and schematic form a single decode path group, such as decode path group 112, associated with the present disclosure.

FIG. 2 includes a memory cell 204, which can be a flash memory cell or a static dynamic random access memory (SRAM) memory cell, a set of column select transistors 206, tri-statable driver 220, capacitor 312, comparator 234, and a precharge transistor 216. Tri-statable driver 220 is coupled to at least one transistor of the set of column select transistors 206. The interconnect node connecting the output of the tri-statable driver 220 to at least one transistor of the set of column select transistors 206 is capacitively coupled to VSS through capacitor 312 while the other decode/amplifier gates of the group are deasserted. This capacitive coupling can result from a parasitic capacitance, or a discrete capacitor. In one embodiment, an appropriate capacitance can be obtained by routing select lines adjacent to each other, such that each asserted select line (i.e. line 210) is adjacent to one or more unasserted select lines biased at an appropriate voltage reference. For example, the nodes 210 and 211 can be routed immediately adjacent to each other, since only one will provide an asserted signal during decode, the asserted line will be capacitively coupled to the deasserted line during. By providing the reference voltage 218 to the deasserted line, an appropriate capacitive coupling will be achieved. The appropriate voltage reference of this capacitance is the same voltage reference as applied to the memory cell 204. To assure noise immunity of the system, the voltage references should not be isolated from each other.

It will be appreciated that the set of column select transistors 206 can comprise one or more transistors and are used to address/select a specific memory cell. Where a single transistor is used it will be controlled by a tri-statable driver 220 as illustrated. Where a plurality of column select transistors is used at least one of the select transistors will be controlled by a tri-statable driver. Typically, the transistor gate closest to the memory cell will be the gate chosen to be the decode/amplifier gate in accordance with the present disclosure.

The decode/amplifier driver 220 is used to perform multiple functions during a memory access. This can be better understood with reference to the timing diagram of FIG. 4, which illustrates an address signal 412, precharge control signal 414, and a comparator control signal 416.

In operation, it is during the time 402 that the address signal 412 is asserted. When the address is being asserted, the column select input signal at node 226 to tri-statable driver 220 is asserted or deasserted to apply an appropriate control signal to the decode/amplifier gate 208. When the decode/amplifier gate 208 is coupled to a bit cell 204 that is to be read during the current cycle, the tri-state enable signal at node 224 is deasserted to allow an enabling voltage to the gate 208 so that bit line 250 will be precharged.

During a time 404, the precharge voltage is applied through the precharge transistor 216. In the specific embodiment illustrated, the precharge voltage is derived from VDD, and the bit line 250 will be precharged to VBIAS-Vt, where Vt is the voltage threshold of the transistor 208. It should be noted, however, that during the precharge time 404 the other select transistors, such as transistor 214 in FIG. 2 that is coupled to node 228, need to be enabled to allow precharge of the bit lines. Typically, the decode/amplifier gate 208 will be selected to be an N-channel gate to allow for a high gain characteristic to support rapid charge of the bit line during the precharge time 404. Unlike the decode/amplifier gate 208, the other chip select gates, such as transistor 214, can be P channel transistors, which are selected during decode, to reduce voltage drop of the precharge voltage.

Figure 4:
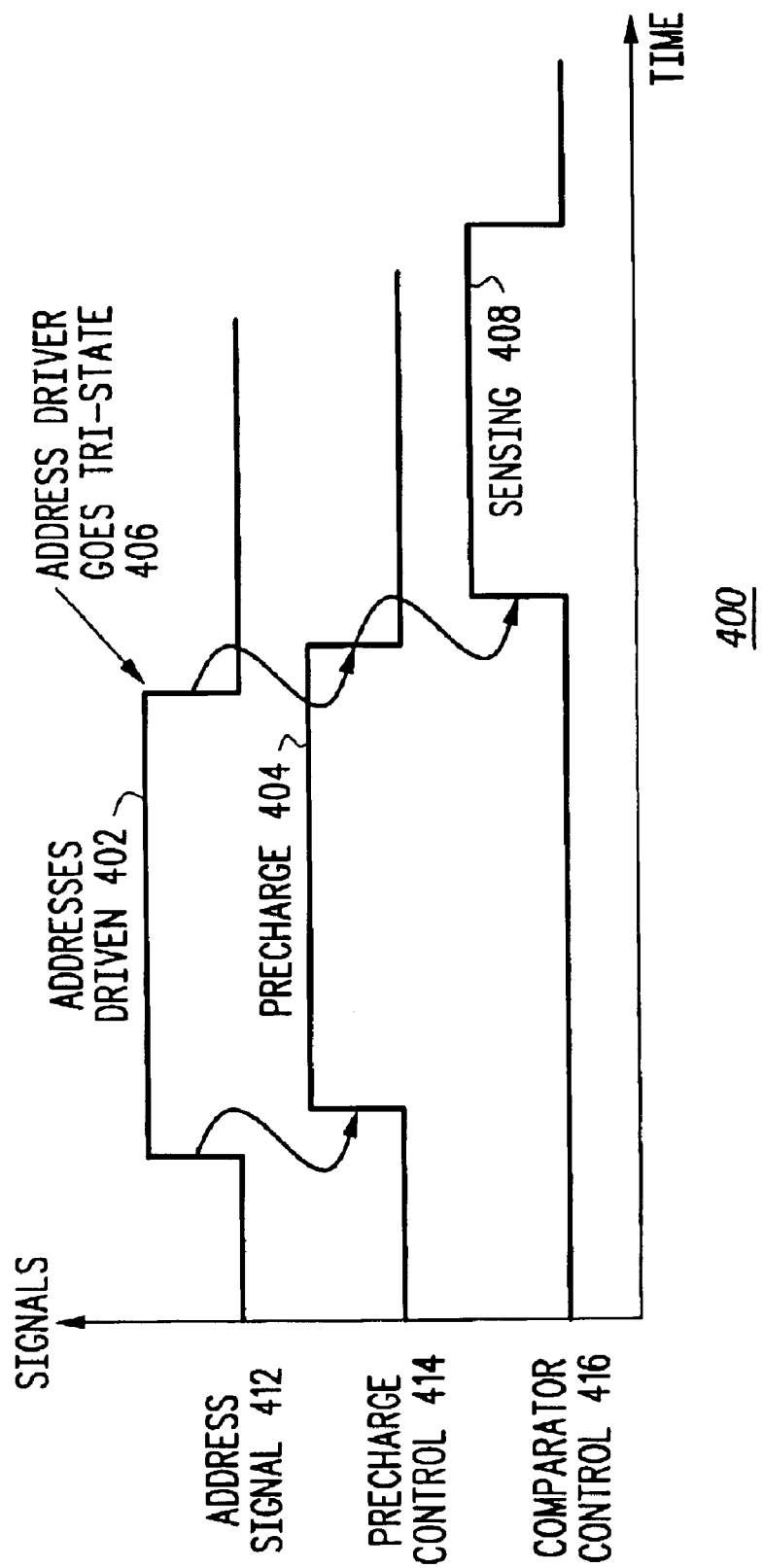
FIG. 4 illustrates a timing diagram in accordance with a specific embodiment of the invention.

The precharge of the bit line 250 is completed when the precharge signal 230 is no longer asserted, at the end precharge time 404, as illustrated in the timing diagram of FIG. 4. At time 406, the tri-statable driver 220 is tri-stated and the node 210 connected to decode/amplifier gate 208 is allowed to float. This maintains decode/amplifier gate 208 in a conductive state after precharge. While the node 210 is allowed to float, a sensing signal 416 is enabled during time 408. Because the node 210, now floating, is capacitively coupled to the same reference as the memory cell 204, the circuit path which includes the decode/amplifier gate 208, and the memory cell 204 is substantially immune to noise on the reference VSS. It will be appreciated that this immunity arises from the fact that noise on the control node of the decode/amplifier gate 208 will track the noise on the reference of the bit cell 204. The decode/amplifier gate 208 is, therefore, configured as a floating gate amplifier, in that it is configured as a common gate amplifier having a gate that is allowed to float During precharge, the tri-statable driver 220 enables the decode/amplifier gate 208 to be conductive, therefore, the transistor 208 remains conductive after precharge when the signal on its gate is left to float. During the time 408, when the transistor 208 is being driven by the floating voltage, the same transistor 208 acts as a floating gate amplifier. Characteristics of the transistor 208 are chosen so that during period 408 a high gain is provided, thereby providing the ability for the comparator (sense amplifier) 190 to quickly sense the charge state of the memory cell 204. By selecting the gate 208 to have a high transconductance, a relatively small change in voltage on the bit line 250 is readily detectable at the data line.

FIG. 2 further illustrates a second decode/amplifier gate 238 and memory cell 240. It will be appreciated that one or more such decode/amplifier gates and memory cells maybe associated with each data line.

Figure 3:
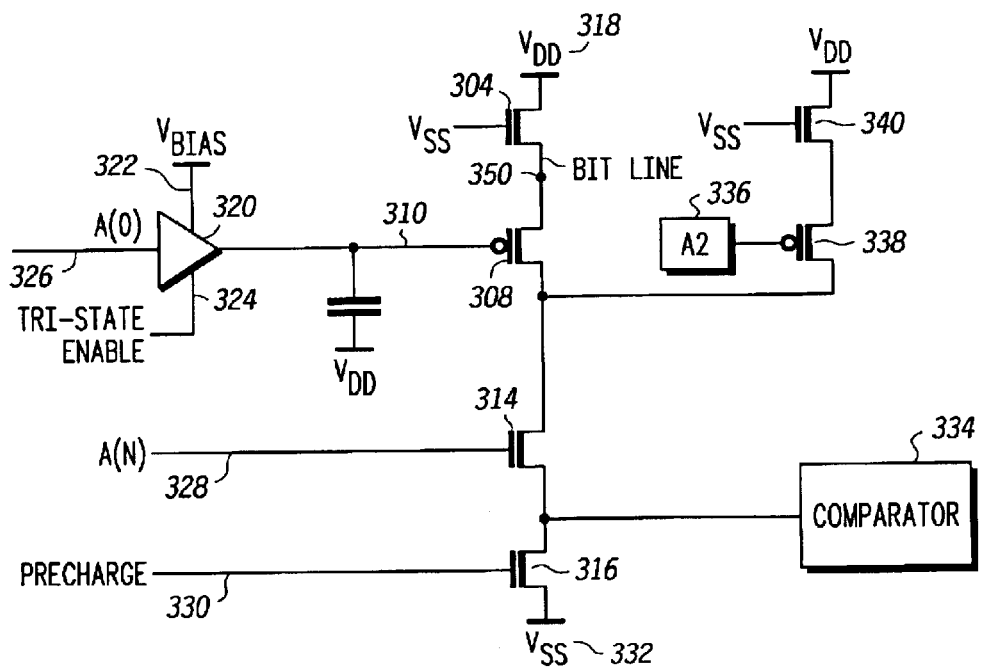
FIG. 3 illustrates in block and schematic diagram form an alternate embodiment of the device portion of FIG. 2.

FIG. 3 illustrates another embodiment of the present invention where conductivity types of the devices illustrated have been generally reversed. In other words, the decode/amplifier gate 308 illustrated in FIG. 3 is now a P-type transistor as opposed to an N-type transistor in FIG. 2. The memory cell 304 remains an N-channel device, however, and is connected to a reference voltage of VDD as opposed to VSS. It will be appreciated, that typically the polarity type of the decode/amplifier gate 308 and the precharge gate 316 will be opposite polarities, however this is not a strict requirement. Furthermore, even though the term "precharge" is used with reference to the device of FIG. 3, it will be appreciated that in reality a discharge of the bit line 350 would actually occur during a precharge time. However, it will be appreciated that the term "precharge" is used to indicate the appropriate voltage conditioning of the bit line, regardless of the transistors types being used.

Figure 5:
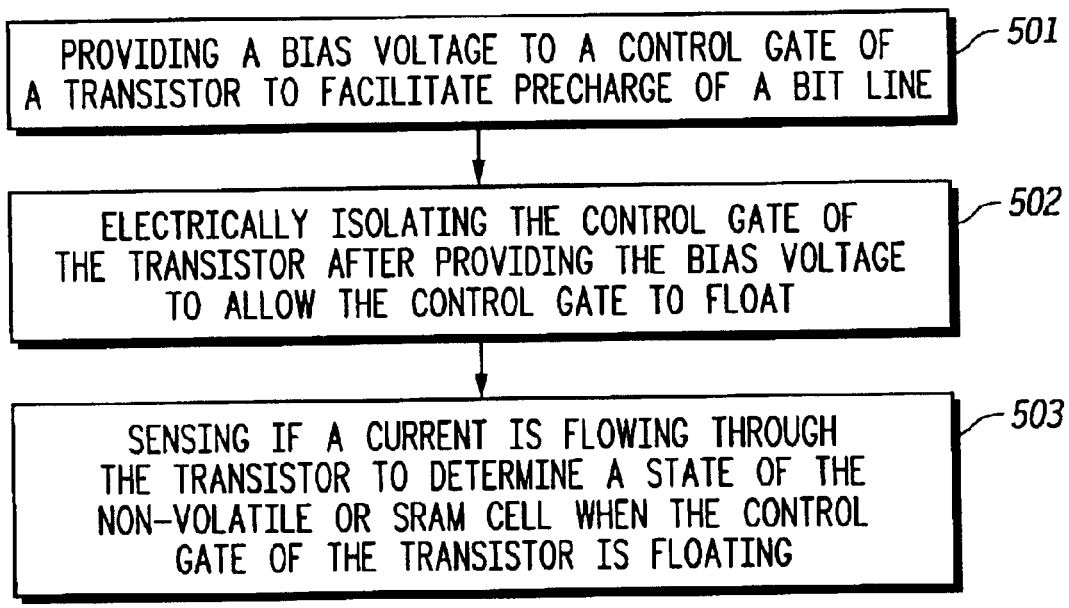
FIG. 5 illustrates, in flow diagram form, a timing diagram in accordance with a specific embodiment of the invention.

FIG. 5 illustrates, in flow diagram form, a method of reading a flash or SRAM memory cell in accordance with a specific embodiment the present disclosure. At step 501, a bias voltage is provided to a control gate of a transistor that acts as a column select transistor during a precharge time to facilitate the precharge of a bit line of a non-volatile memory cell, or an SRAM device. At step 502, the control gate of the transistor is electrically isolated to allow the control gate to float. By allowing the voltage on the transistor gate to float, the transistor acts as an amplifier during a subsequent sense operation. At step 503, a sense operation occurs to determine if a current is floating through the transistor to further determine a charge state of the non-volatile or SRAM cell when the control gate is floating. In this manner, as previously discussed with respect to FIGS. 1–4, an improved memory device and method of using is realized.

It will therefore be appreciated, the use of a decode/amplifying gate as indicated herein results in a memory design having reduced complexity over the prior art.

In the preceding detailed description of the figures, reference has been made to the accompanying drawings, which form a part thereof, and in which is shown by way of illustration specific embodiments in which the invention may be practiced. These embodiments are described in sufficient detail to enable those skilled in the art to practice the invention, and it is to be understood that other embodiments may be utilized and that logical, mechanical, chemical, and electrical changes may be made without departing from the spirit or scope of the invention.

To avoid detail not necessary to enable those skilled in the art to practice the invention, the description may omit certain information known to those skilled in the art. Furthermore, many other varied embodiments that incorporate the teachings of the invention may be easily constructed by those skilled in the art. Accordingly, the present disclosure is not intended to be limited to the specific form set forth herein, but on the contrary, it is intended to cover such alternatives, modifications, and equivalents, as can be reasonably included within the spirit and scope of the invention. The preceding detailed description is, therefore, not to be taken in a limiting sense, and the scope of the present disclosure is defined only by the appended claims.

What is claimed is:

1. A memory device having a decode path, comprising:
   a flash memory cell having a flash cell first current electrode, a flash cell second current electrode, and a flash cell control electrode;
   a set of column select transistors, including at least one column select transistor having a column select transistor first current electrode connected to the flash cell first current electrode, a column select transistor second current electrode, and at least one column select transistor control electrode;
   a tri-statable control logic coupled to the column select transistor control electrode; and
   a precharge transistor having a precharge transistor first current electrode coupled to the at least one column select transistor second current electrode, a precharge transistor second current electrode, and a precharge transistor select electrode.

2. The memory device of claim 1, wherein the set of column select transistors comprises
   a first N-type transistor and wherein the precharge transistor is a P-type transistor.

3. The memory device of claim 1, wherein the at least one column select transistor is an N-type transistor, and the precharge transistor is a P-type transistor.

4. The memory device of claim 1, wherein the set of column select transistors comprises
   a first N-type transistor and a second transistor.

5. The memory device of claim 4, wherein the second transistor is a P-type transistor.

6. A memory device having a decode path, comprising:
   an SRAM (Static Random Access Memory) memory cell having an SRAM cell first current electrode, an SRAM cell second current electrode, and an SRAM cell control electrode;
   a set of column select transistors, including at least one column select transistor having a column select transistor first current electrode connected to the SRAM cell first current electrode, a column select transistor second current electrode, and at least one column select transistor control electrode;
   a tri-statable control logic coupled to the column select transistor control electrode; and
   a precharge transistor having a precharge transistor first current electrode coupled to the at least one column select transistor second current electrode, a precharge transistor second current electrode, and a precharge transistor select electrode.

7. The memory device of claim 6, wherein the set of column select transistors further comprises a first transistor having a first transistor control electrode coupled to tri-statable control logic.

8. The memory device of claim 7, wherein the first transistor is the at least one column select transistor.

9. A device comprising:
   a non-volatile memory (NVM) cell having a NVM first current electrode and a NVM second current electrode;
   a column select transistor having a column select transistor first transistor current electrode coupled to the NVM second current electrode and a column select transistor gate; and
   a tri-statable control module having a tri-statable output coupled to the column select transistor gate.

10. The device of claim 9, wherein the non-volatile memory cell has a NVM select electrode.

11. The device of claim 9, wherein the column select transistor has a column select transistor second current electrode.

12. The device of claim 11, further comprising a sense module coupled to the column select transistor second electrode, wherein the tri-statable control module is to provide a tri-state signal to the column select transistor gate during a time period when the sense module is to sense a state of the non-volatile memory cell.

13. The device of claim 12, wherein the sense module comprises a comparator device.

14. A method of operating a non-volatile memory device, the method comprising:
   providing a bias voltage to a control gate of a transistor to facilitate charging a bit line of a non-volatile cell;
   electrically isolating the control gate of the transistor after providing the bias voltage to allow the control gate to float;
   sensing a current through the transistor to determine a state of the non-volatile cell when the control gate of the transistor is floating.

15. The method of claim 14, wherein the step of sensing a current is performed by a comparator module.

16. The method of claim 15, wherein the comparator module is part of a sense amplifier.

17. A method comprising:
   applying an address to select a memory cell of a memory, the memory cell supplied by a supply reference voltage;

enabling a transistor to apply a charge to a bit line coupled to the memory cell during a first time period; and capacitively coupling a control gate of the transistor to the supply reference voltage during a second time period.

18. The method of claim 17, further comprising:

sensing a current level of the selected memory cell during the second time period.

19. The method of claim 17, wherein sensing further comprising sensing a signal amplified by the transistor.

20. A device comprising:

a memory having a plurality of memory cells, the plurality of memory cells supplied by a supply reference voltage;

address selection logic to apply an address to select at least one memory cell of the plurality of memory cells;

a pre-charge element to provide a charge to charge a bit line corresponding to the at least one memory cell; and a single transistor coupled to the bit line, the single transistor is to allow the bit line to charge during a first time period, and is to operate as a floating gate amplifier during a second time period, where a gate of the single transistor is to float with respect to the supply reference voltage.

21. The device of claim 20, further comprising a comparison device responsive to the single transistor during the second time period, the comparison device to detect a current.

* * * * *